United States Patent
Taddiken

(10) Patent No.: US 7,382,025 B2
(45) Date of Patent: Jun. 3, 2008

(54) ESD PROTECTION STRUCTURE WITH LOWER MAXIMUM VOLTAGE

(75) Inventor: Hans Taddiken, Munich (DE)

(73) Assignee: Infineon Technologies AG, Munich (DE)

( * ) Notice: Subject to any disclaimer, the term of this patent is extended or adjusted under 35 U.S.C. 154(b) by 216 days.

(21) Appl. No.: 11/051,368

(22) Filed: Feb. 4, 2005

(65) Prior Publication Data

US 2005/0179055 A1 Aug. 18, 2005

(30) Foreign Application Priority Data

Feb. 18, 2004 (DE) .................. 10 2004 007 972

(51) Int. Cl.
*H01L 23/62* (2006.01)
(52) U.S. Cl. ................. 257/362; 257/E27.037
(58) Field of Classification Search ........... 257/362, 257/E27.037
See application file for complete search history.

(56) References Cited

U.S. PATENT DOCUMENTS

| | | | |
|---|---|---|---|
| 4,100,561 A * | 7/1978 | Ollendorf | 257/589 |
| 5,731,941 A * | 3/1998 | Hargrove et al. | 361/56 |
| 6,242,793 B1 | 6/2001 | Colombo et al. | |
| 6,372,597 B2 | 4/2002 | Colombo et al. | |
| 6,919,603 B2 * | 7/2005 | Brodsky et al. | 257/361 |

FOREIGN PATENT DOCUMENTS

EP    0 932 203 A1    7/1999

* cited by examiner

*Primary Examiner*—Howard Weiss
(74) *Attorney, Agent, or Firm*—Slater & Matsil, L.L.P.

(57) ABSTRACT

A semiconductor structure for protecting integrated circuits from ESD pulses includes a semiconductor substrate of a first conductivity type and with a first dopant concentration. A well of a second conductivity type and with a second dopant concentration lies within the semiconductor substrate. Additionally, the semiconductor structure comprises a first area of a first conductivity type and with a third dopant concentration, wherein at least a first part of the area lies within the well. Further, there is a second area of a first conductivity type and with a fourth dopant concentration, the second area being fully within the well. A first protective zone of a second conductivity type and with a fifth dopant concentration lies in the well between the first area and the second area.

19 Claims, 2 Drawing Sheets

ESD PROTECTION STRUCTURE WITH LOWER MAXIMUM VOLTAGE

CROSS-REFERENCE TO RELATED APPLICATION

This application claims priority from German Patent Application No. 102004007972.2, which was filed on Feb. 18, 2004 and is incorporated herein by reference in its entirety.

BACKGROUND OF THE INVENTION

1. Field of the Invention

The present invention relates to a semiconductor structure for the protection of integrated circuits from ESD pulses.

2. Description of the Related Art

If electrically charged subjects or persons are brought into contact with an input or output of an integrated circuit, a discharge can take place, where a current exceeding the standard measure flows through to the integrated circuit and a high voltage drops across the same. This can possibly lead to the destruction of the integrated circuit.

For the protection of integrated circuits from these electrical discharges, so called ESD pulses (ESD=electrostatic discharge) the inputs and outputs of the integrated circuits are provided with protective structures, which are to guarantee a safe drain of the discharge currents.

Therefore, in some applications, a pnp bipolar transistor is used as a protective structure, where the base is not connected, i.e., the base "floats". If an ESD pulse reaches such a pnp bipolar transistor, the same breaks down. Thereby, however a low voltage is to drop across the broken-down pnp bipolar transistor, since the integrated circuit to be protected is connected in parallel and thus experiences the same voltage. A voltage drop, which is too high, could lead to breakdowns of the integrated circuit.

Therefrom, the requirement results that the resistance of the pnp bipolar transistor is to be as low as possible so that only a low voltage drops across the same.

The resistance could be lowered by increasing the base doping.

On the other hand, the base doping of the pnp bipolar transistor should not be too high, since, during standard operation, the transistor may only break above its operating voltage. Thus, a certain maximum doping of the base cannot be exceeded. Therefrom, a minimum resistance results and thus a minimum voltage drop across the pnp bipolar transistor in the ESD case.

SUMMARY OF THE INVENTION

It is the object of the present invention to provide an improved ESD protection structure that can be sized such that its breakdown voltage is higher than a required operating voltage and its voltage drop in the ESD case is below a damaging effect for the integrated circuit.

The present invention provides a semiconductor structure for protecting integrated circuits from ESD pulses, having a semiconductor substrate of a first conductivity type and with a first dopant concentration, a well of a second conductivity type and with a second dopant concentration lying within a semiconductor structure, a first area of the first conductivity type and with a third dopant concentration, wherein at least a first part of the first area lies within the well, a second area of the first conductivity type and with a fourth dopant concentration, wherein the second area lies fully within the well and is spaced apart from the first area, wherein a protective zone of the second conductivity type and with a fifth dopant concentration is in the well between the first area and the second area.

In the ESD case, the resistance of the semiconductor structure is lowered by the protective zone, and a lower voltage drops across the semiconductor structure. Thus, damage to the integrated circuit to be protected is avoided. Additionally, the protective zone having the same conductivity type than the well surrounding the same does not influence the breakdown voltage, since the breakdown voltage is mainly determined by the doping difference between the first area and the well or the second area and the well. This depends on the plurality of the voltage and the type of the doping.

Preferred developments of the invention are defined in the dependent claims.

A preferred development of the inventive semiconductor structure provides that at least a first part of a third area of the first conductivity type and a third dopant concentration lies within the well and a second protective zone of the second conductivity type and with a fifth dopant concentration lies within the well between the second area and the third area.

Thereby, a symmetrical construction of the semiconductor structure is provided, which leads to a particularly favorable breakdown behavior in the ESD case and effects a space-saving construction.

A further preferred embodiment of the invention provides for a space between the first area and the second protective zone and between the second area and the first protective zone, respectively. Thereby, it is to be prevented that the protective zone can have a negative influence on the space charge region at the pn junction between the first and second area, respectively, and the well, which would possibly lead to a lowering of the breakdown voltage.

It is also advantageous when there is a space between the third area and the second protective zone and between the second area and the second protective zone, respectively. Thereby, it is to be prevented that the protective zone has a negative effect on the space charge region at the pn junction between the third and second area, respectively, and the well.

Typically, the well is a connectionless base of a bipolar transistor. Thereby, a current flow through the base in negative and in positive direction is enabled. A connection of the base to a certain potential would lead to a selective preference of a current direction. Since the integrated circuit does have to be protected both from positively and from negatively charged subjects or persons, a preference direction is not practicable.

It is advantageous when the second dopant concentration is higher than the first dopant concentration. Thereby, the well can be used as base for a bipolar transistor.

Preferably, the third, fourth and fifth dopant concentration are higher than the second dopant concentration. Contact zones—particularly emitter and collector of a bipolar transistor are formed by the higher third and fourth dopant concentration, while the conductivity of the protective zone is higher than the conductivity of the well due to the higher fifth dopant concentration, which leads to a lowering of the resistance in the well as a whole. Thus, in the ESD case, less voltage drops across the semiconductor structure. Thus, a damage to the integrated circuit to be protected is avoided.

In a further preferred embodiment of the inventive semiconductor structure, the third and fourth dopant concentrations are equal. Thereby, the first, second and an eventually existing third area can be inserted simultaneously into the semiconductor structure with the same process parameters. This means a significant simplification of the production method.

Typically, the maximum second dopant concentration is $5 \times 10^{17}$ cm$^{-3}$ and the fifth dopant concentration is more than $5 \times 10^{17}$ cm$^{-3}$.

DESCRIPTION OF THE DRAWINGS

These and other objects and features of the present invention will become clear from the following description taken in conjunction with the accompanying drawings, in which.

The following list of reference symbols can be used in conjunction with the figures

| | |
|---|---|
| 1 | semiconductor substrate |
| 2 | well |
| 3 | first area |
| 4 | second area |
| 5 | first protective zone |
| 6 | third area |
| 7 | second protective zone |
| 8, 9, 10, 11 | space |
| 20, 21, 30, 31, 40, 41 | curve |

DESCRIPTION OF THE PREFERRED EMBODIMENTS

Figure 1:
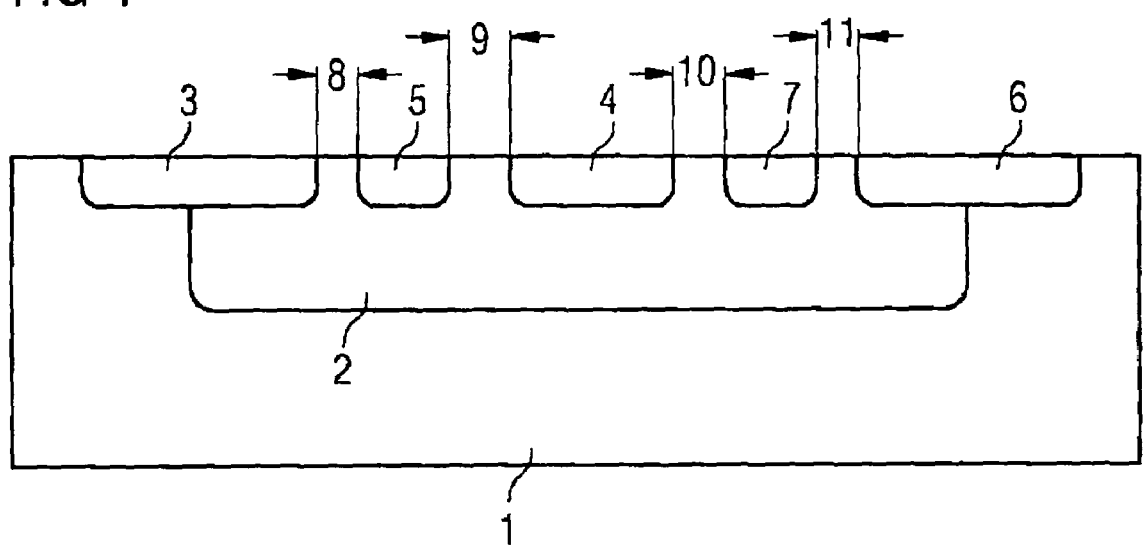
FIG. 1 is a shematical cross section view of a preferred embodiment of the inventive semiconductor structure.

A preferred embodiment of the inventive semiconductor structure is illustrated in FIG. 1 in a schematical cross section view. A well 2 with an n dopant concentration of maximum $5 \times 10^{17}$ cm$^{-3}$ lies in a p semiconductor substrate with a p dopant concentration of about $1 \times 10^{15}$ cm$^{-3}$. The well 2 is implanted into the semiconductor structure 1 with a phosphor dose of about $4.5 \times 10^{13}$ cm$^{-2}$ and extends from a surface of the semiconductor substrate 1 about 4 to 5 µm into the center of the semiconductor substrate 1. The well 2 serves as base for a pnp bipolar transistor.

A first area 3 is at the first side edge of the well 2. The first area 3 extends also from the surface of the semiconductor substrate into its center. Thereby, a first part of the first area 3 is within the well 2, while a second part is outside the well 2 in the semiconductor substrate 1. Thus, in a later application, the first area 3 can be connected to ground potential.

The first area 3 is p doped with a maximum dopant concentration of $1.5 \times 10^{20}$ cm$^{-3}$ and is implanted with a boron dose of $2 \times 10^{15}$ cm$^{-2}$ into the semiconductor substrate 1 and the well 2, respectively.

p$^+$ contact implantations (not shown), which are implanted with boron doses of $5 \times 10^{15}$ cm$^{-2}$ and $2 \times 10^{15}$ cm$^{-2}$, are within the center of the first area. The distance of the p$^+$ contact implantations from the pn junction of the first area 3 to the well 2 is about 2 µm.

A third area 6 with the same characteristics as the first area 3 is on a second side edge of the well 2 opposite to the first side edge in a dual way.

A second area 4, which has the same dopings as the first and second areas, is illustrated in the well between the first area 3 and the third area 6.

The first area 3 and the second area 4 and the third area 6 and the second area 4, respectively, each form a pnp bipolar transistor together with the well 2. In the case of an ESD pulse, the first and third area 3 and 6 act as emitter or collector depending on the polarity of the ESD pulse, while the second area 4 represents the corresponding collector or emitter.

A first protective zone 5 and a second protective zone 7, respectively, are represented in the well 2, approximately in the middle between the first area 3 and the second area 4 and between the second area 4 and the third area 6, respectively.

The protective zones are n doped, have a minimum dopant concentration of $5 \times 10^{15}$ cm$^{-3}$ and are implanted in the well with an arsenic dose of $5 \times 10^{15}$ cm$^{-2}$. The protective zone has a space to the adjacent first, second and the third areas, which is about 3 µm.

The base width between the first and second area and between the second and third area, respectively, is about 9 µm.

Figure 2:
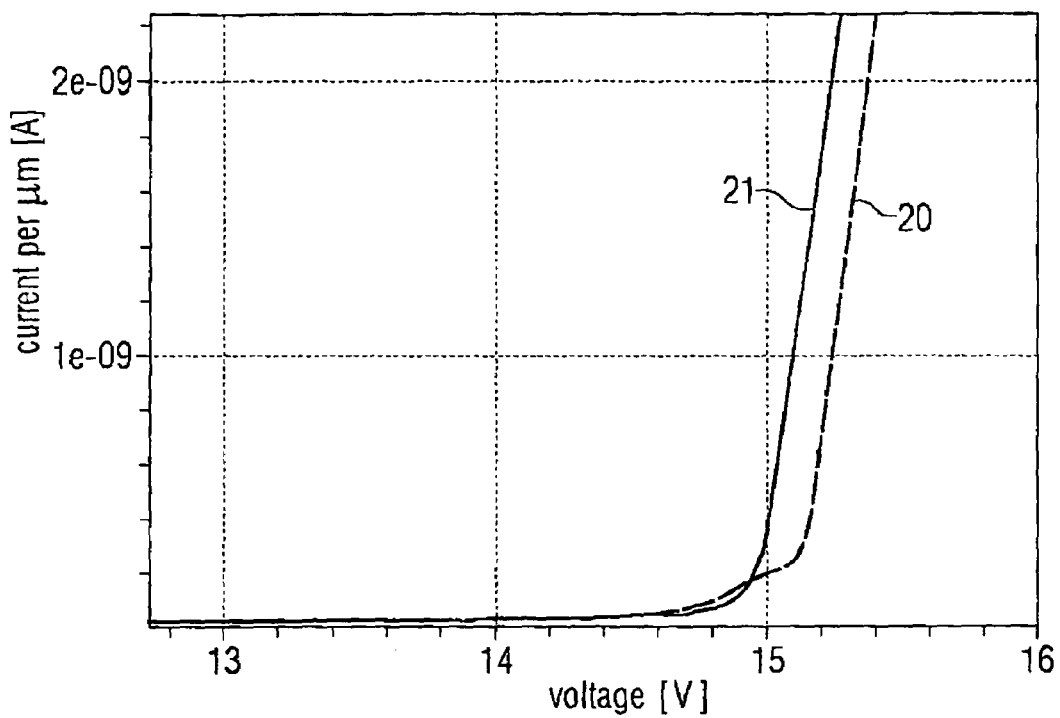
FIG. 2 is a shematical representation of the simulated current voltage curve of a semiconductor structure according to the prior art and an inventive semiconductor structure.

The current voltage curve for a semiconductor structure of the prior art and an inventive semiconductor structure illustrated in FIG. 2 is the result of a simulation where the emitter collector voltage is slowly increased. Curve 20 shows the current behavior of a conventional semiconductor structure in dependence on the emitter collector voltage. The current voltage curve shows a significant increase of the current from a voltage of about 15 Volt, i.e., the transistor breaks through at about 15 Volt.

Curve 21 shows the current voltage behavior of an inventive semiconductor structure. The current voltage curve shows also a significant increase of the current from a voltage of about 15 Volt, i.e., the transistor breaks through at about 15 Volt as well.

Thus, the simulation results prove that the breakdown behavior of an inventive semiconductor structure almost does not change compared to a conventional semiconductor structure. There is no significant reduction of the breakdown voltage.

Figure 3:
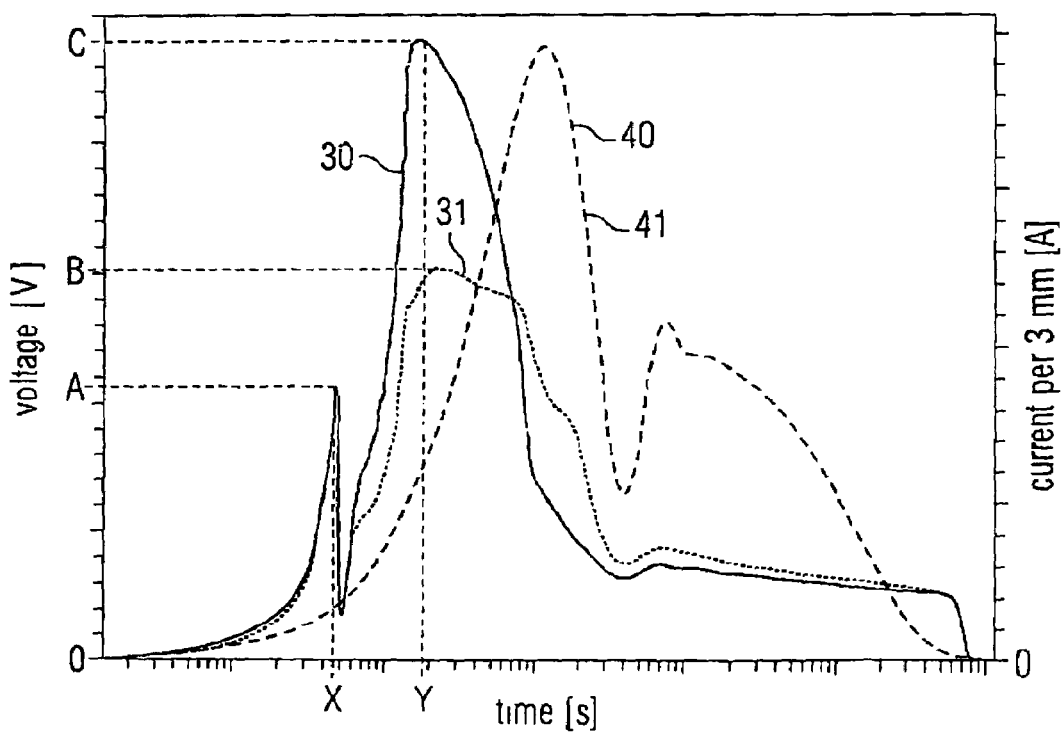
FIG. 3 is a shematical representation of the simulated voltage curve and the simulated current curve, respectively, of an ESD event in dependence on time in the semiconductor structure according to the prior art and in an inventive semiconductor structure.

The simulated voltage curve is illustrated qualitatively and schematically in dependence on time in an ESD event in FIG. 3 with the help of curve 30 of a conventional semiconductor structure. Thereby, a first voltage peak can be seen at time X. This is the time of the breakdown of the transistor with a breakdown voltage A.

A second voltage peak is illustrated in curve 30 at time Y. The occurring voltage C is the voltage dropping across the broken down semiconductor structure.

Curve 31 illustrates the simulated voltage curve of an inventive semiconductor structure in dependence on the time in an ESD event in schematical and qualitative form. The breakdown at time X has the same breakdown voltage A as the conventional semiconductor structure. A second voltage peak can also be seen at time Y, like in the conventional semiconductor structure. But the occurring voltage B is significantly lower than the voltage C. Thus, the danger of a damage for an integrated circuit to be protected by the inventive semiconductor structure is significantly lower.

Curves 40 and 41 show the simulated current curve of a conventional and an inventive semiconductor structure in dependence on time in schematical and qualitative form. Both curves are identical.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A semiconductor structure for the protection of integrated circuits from ESD pulses, the structure comprising:
   a semiconductor substrate of a first conductivity type and with a first dopant concentration;
   a well of a second conductivity type and with a second dopant concentration lying within the semiconductor substrate;
   a first area of the first conductivity type and with a third dopant concentration, wherein at least a first part of the first area lies within the well, wherein the first area lies partially in the well and partially in the substrate outside the well;
   a second area of the first conductivity type and with a fourth dopant concentration, wherein the second area lies fully within the well and is spaced apart from the first area; and
   a first protective zone of the second conductivity type and with a fifth dopant concentration disposed in the well between the first area and the second area, the first protective zone being spaced from the first area by the well and being spaced from the second area by the well.

2. The semiconductor structure of claim 1, further comprising:
   a third area of the first conductivity type and with the third dopant concentration, wherein a first part of the third area lies within the well and a second part of the third area lies within the substrate outside the well; and
   a second protective zone of the second conductivity type and with the fifth dopant concentration disposed in the well between the third area and the second area, the first protective zone being spaced from the third area by the well and being spaced from the second area by the well.

3. The semiconductor structure of claim 2, wherein the first area is electrically coupled to the third area.

4. The semiconductor structure of claim 1, wherein the second dopant concentration is higher than the first dopant concentration.

5. The semiconductor structure of claim 1, wherein the third, fourth and fifth dopant concentrations are higher than the second dopant concentration.

6. The semiconductor structure of claim 1, wherein the third and fourth dopant concentrations are equal.

7. The semiconductor structure of claim 1, wherein the second dopant concentration is a maximum of $5 \times 10^{17}$ cm$^{-3}$.

8. The semiconductor structure of claim 1, wherein the fifth dopant concentration is more than $5 \times 10^{17}$ cm$^{-3}$.

9. A semiconductor structure comprising:
   a p-substrate;
   an n-well disposed within the p-substrate;
   a first p-doped area overlapping a first edge of the n-well such that a first portion of the first p-doped area lies within the n-well and a second portion of the first p-doped region lies within the p-substrate outside the n-well;
   a second p-doped area disposed entirely within the n-well;
   a third p-doped area overlapping a second edge of the n-well such that a first portion of the third p-doped area lies within the n-well and a second portion of the third p-doped region lies within the p-substrate outside the n-well, the second edge opposed to the first edge;
   a first n-doped protective zone disposed within the n-well between the first p-doped area and the second p-doped area, the first n-doped protective zone being spaced from the first p-doped area by a first portion of the n-well and being spaced from the second p-doped area by a second portion of the n-well; and
   a second n-doped protective zone disposed within the n-well between the second p-doped area and the third p-doped area, the second n-doped protective zone being spaced from the second p-doped area by a third portion of the n-well and being spaced from the third p-doped area by a fourth portion of the n-well.

10. A semiconductor structure for the protection of integrated circuits from ESD pulses, the structure comprising:
    a semiconductor substrate of a first conductivity type and with a first dopant concentration;
    a well of a second conductivity type and with a second dopant concentration lying within the semiconductor substrate;
    a first area of the first conductivity type and with a third dopant concentration, wherein at least a first part of the first area lies within the well;
    a second area of the first conductivity type and with a fourth dopant concentration, wherein the second area lies fully within the well and is spaced apart from the first area, wherein a voltage difference applied between the first area and the second area will cause a current to flow between the first area and the second area; and
    a first protective zone of the second conductivity type and with a fifth dopant concentration disposed in the well between the first area and the second area, the first protective zone being spaced from the first area by the well and being spaced from the second area by the well.

11. The semiconductor structure of claim 10, wherein the first area, the well and the second area form a bipolar transistor wherein the well forms a base region, the first area forms one of either an emitter region or a collector region and the second area forming the other of the emitter region or the collector region.

12. The semiconductor structure of claim 10, wherein the first area lies partially in the well and partially in the substrate outside the well.

13. The semiconductor structure of claim 12, further comprising:
    a third area of the first conductivity type and with the third dopant concentration, wherein a first part of the third area lies within the well and a second part of the third area lies within the substrate outside the well; and
    a second protective zone of the second conductivity type and with the fifth dopant concentration disposed in the well between the third area and the second area, the first protective zone being spaced from the third area by the well and being spaced from the second area by the well.

14. The semiconductor structure of claim 13, wherein the first area is electrically coupled to the third area.

15. The semiconductor structure of claim 10, wherein the second dopant concentration is higher than the first dopant concentration.

16. The semiconductor structure of claim 10, wherein the third, fourth and fifth dopant concentrations are higher than the second dopant concentration.

17. The semiconductor structure of claim 10, wherein the third and fourth dopant concentrations are equal.

18. The semiconductor structure of claim 10, wherein the second dopant concentration is a maximum of $5\times10^{17}$ cm$^{-3}$.

19. The semiconductor structure of claim 10, wherein the fifth dopant concentration is more than $5\times10^{17}$ cm$^{-3}$.

* * * * *